(12) United States Patent
Kim et al.

(10) Patent No.: US 10,872,851 B2
(45) Date of Patent: Dec. 22, 2020

(54) SEMICONDUCTOR PACKAGE

(71) Applicant: SAMSUNG ELECTRONICS CO., LTD., Suwon-si (KR)

(72) Inventors: Eun Jin Kim, Suwon-si (KR); Han Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/797,513

(22) Filed: Feb. 21, 2020

(65) Prior Publication Data

US 2020/0194360 A1    Jun. 18, 2020

Related U.S. Application Data

(63) Continuation of application No. 16/105,289, filed on Aug. 20, 2018, now Pat. No. 10,573,589.

(30) Foreign Application Priority Data

Feb. 5, 2018    (KR) ......................... 10-2018-0014067

(51) Int. Cl.
*H01L 23/498*     (2006.01)
*H01L 23/31*      (2006.01)
*H01L 23/043*     (2006.01)

(52) U.S. Cl.
CPC ...... *H01L 23/49822* (2013.01); *H01L 23/043* (2013.01); *H01L 23/3128* (2013.01); *H01L 23/49816* (2013.01); *H01L 23/49838* (2013.01)

(58) Field of Classification Search
CPC .......... H01L 23/49822; H01L 23/3128; H01L 23/043; H01L 23/49816; H01L 23/49838
See application file for complete search history.

(56) References Cited

U.S. PATENT DOCUMENTS

2006/0044735 A1    3/2006    Hayashi et al.
2009/0107714 A1    4/2009    Ogasawara
(Continued)

FOREIGN PATENT DOCUMENTS

JP    2006-073622 A    3/2006
JP    2009-111287 A    5/2009
(Continued)

OTHER PUBLICATIONS

Office Action issued in corresponding Korean Application No. 10-2018-0014067, dated Mar. 18, 2019.
(Continued)

*Primary Examiner* — Victor A Mandala
(74) *Attorney, Agent, or Firm* — Sughrue Mion, PLLC

(57) ABSTRACT

A semiconductor package includes a connection member having a first surface and a second surface disposed to oppose each other and including an insulating member having a plurality of insulating layers and a plurality of redistribution layers disposed on the plurality of insulating layers, respectively; a semiconductor chip disposed on the first surface of the connection member and having connection pads electrically connected to the plurality of redistribution layers; and an encapsulant disposed on the first surface of the connection member and encapsulating the semiconductor chip, wherein at least one of the plurality of redistribution layers includes a dummy electrode pattern in which a plurality of holes are arranged, and each of the plurality of holes has a shape including a plurality of protruding regions that protrude externally from different positions.

20 Claims, 15 Drawing Sheets

(56) References Cited

U.S. PATENT DOCUMENTS

| | | | |
|---|---|---|---|
| 2010/0132993 A1* | 6/2010 | Nakamura | H05K 1/0271 |
| | | | 174/260 |
| 2013/0153266 A1 | 6/2013 | Hyun et al. | |
| 2016/0120033 A1* | 4/2016 | Furusawa | H01L 23/49827 |
| | | | 174/251 |
| 2016/0336249 A1 | 11/2016 | Kang et al. | |
| 2016/0336296 A1* | 11/2016 | Jeong | H01L 23/49822 |
| 2017/0033090 A1 | 2/2017 | Hsieh et al. | |
| 2017/0125318 A1 | 5/2017 | Harr et al. | |
| 2017/0228529 A1 | 8/2017 | Huang et al. | |
| 2017/0317029 A1* | 11/2017 | Hsieh | H01L 25/105 |
| 2017/0365572 A1* | 12/2017 | Lee | H01L 24/04 |
| 2019/0295955 A1* | 9/2019 | Hsieh | H01L 21/486 |

FOREIGN PATENT DOCUMENTS

| | | |
|---|---|---|
| KR | 10-2013-0070534 A | 6/2013 |
| KR | 10-2017-0015053 A | 2/2017 |
| KR | 10-2017-0051968 A | 5/2017 |
| TW | 201715664 A | 5/2017 |
| TW | 201729139 A | 8/2017 |
| TW | 201801262 A | 1/2018 |

OTHER PUBLICATIONS

Office Action issued in corresponding Taiwanese Application No. 107128689, dated Feb. 27, 2019.

\* cited by examiner

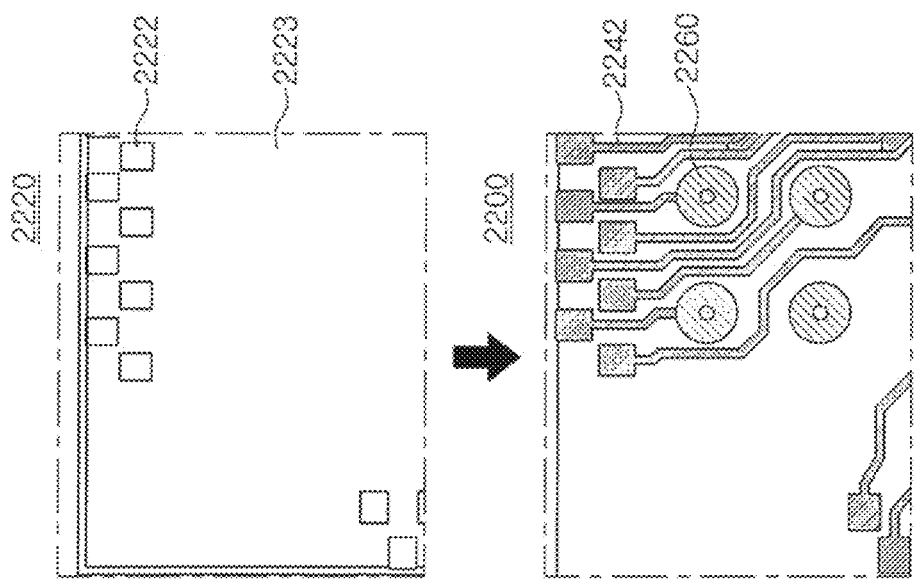
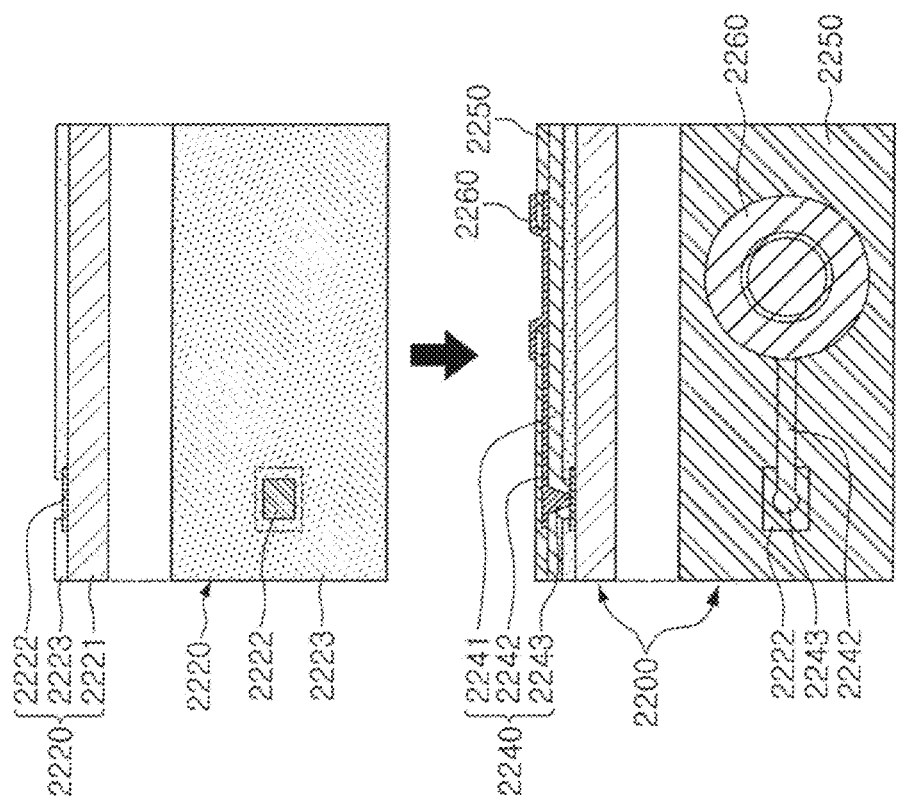
FIG. 3B
FIG. 3A

SEMICONDUCTOR PACKAGE

CROSS-REFERENCE TO RELATED APPLICATION(S)

This application is a continuation application of U.S. patent application Ser. No. 16/105,289, filed on Aug. 20, 2018, issued as U.S. Pat. No. 10,573,589 on Feb. 25, 2020, which claims the benefit of priority to Korean Patent Application No. 10-2018-0014067 filed on Feb. 5, 2018 in the Korean Intellectual Property Office, the disclosure of which is incorporated herein by reference in its entirety.

BACKGROUND

1. Field

The present disclosure relates to a semiconductor package.

2. Description of Related Art

As substrates and packages tend to be smaller and thinner, the size of circuit lines is becoming smaller and more complex, and there is a tendency to use a liquid-type photosensitive resin rather than a film-type photosensitive resin as an insulating layer to form a fine circuit.

In particular, when the circuit is formed using the liquid photosensitive resin, gas and moisture may be discharged from the photosensitive resin in a high temperature heat treatment process such as baking and curing processes, and it is necessary to provide a path for smoothly discharging gas and moisture. However, the provision of such a path provides an insulating layer having an undulation, which may cause an obstacle in forming a circuit line of a fine line width.

SUMMARY

An aspect of the present disclosure may provide a semiconductor package in which a hole promoting a smooth discharge of gas and moisture from an insulating layer may be introduced and a fine wiring pattern of a subsequent process may be stably formed.

An aspect of the present disclosure may provide a hole for gas discharge capable of significantly reducing an undulation of an insulating layer while securing a sufficient total area by configuring the hole to have a plurality of extending parts having a width narrower than a maximum width of the hole.

According to an aspect of the present disclosure, a semiconductor package may include a connection member having a first surface and a second surface opposing each other and including an insulating member having a plurality of insulating layers and a plurality of redistribution layers disposed on the plurality of insulating layers, respectively; a semiconductor chip disposed on the first surface of the connection member and having connection pads electrically connected to the plurality of redistribution layers; and an encapsulant disposed on the first surface of the connection member and encapsulating the semiconductor chip, wherein at least one redistribution layer of the plurality of redistribution layers includes a dummy electrode pattern having a plurality of holes, and each of the plurality of holes has a shape including a plurality of protruding regions that protrude outwardly from different positions on the dummy electrode pattern.

According to another aspect of the present disclosure, a package substrate may include an insulating member having a first surface and a second surface opposing each other; and a plurality of wiring layers disposed on different levels of the insulating member, wherein the plurality of wiring layers include a first wiring layer including a dummy electrode pattern disposed on a first level of the insulating member and having a plurality of holes, each of the plurality of holes having a concave polygonal shape, and a second wiring layer including a wiring pattern disposed on a second level above the first level of the insulating member and overlapped with the plurality of holes.

BRIEF DESCRIPTION OF DRAWINGS

The above and other aspects, features and other advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
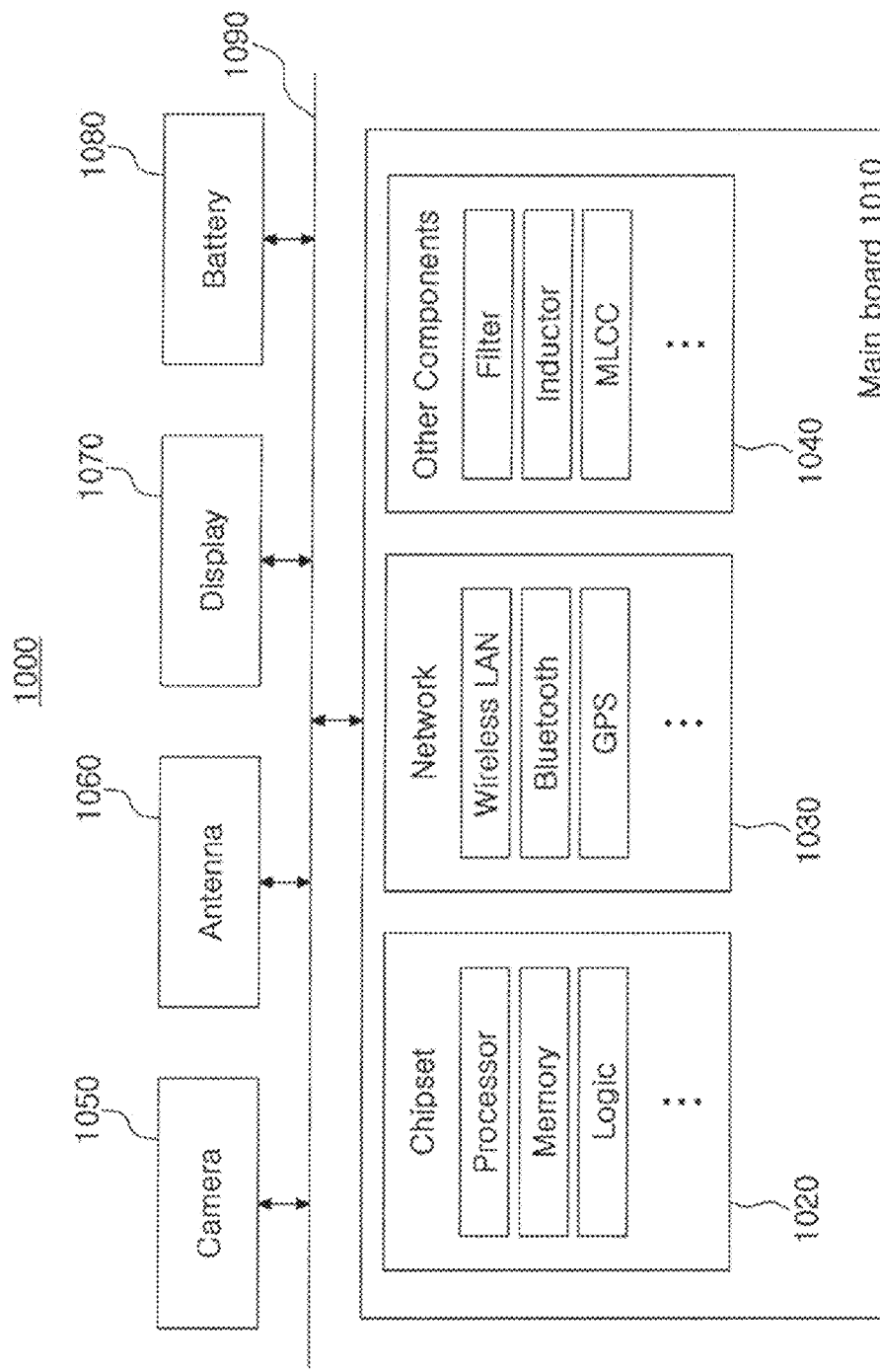
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically and/or electrically connected to the main board 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, but may be any other electronic device processing data.

Figure 2:
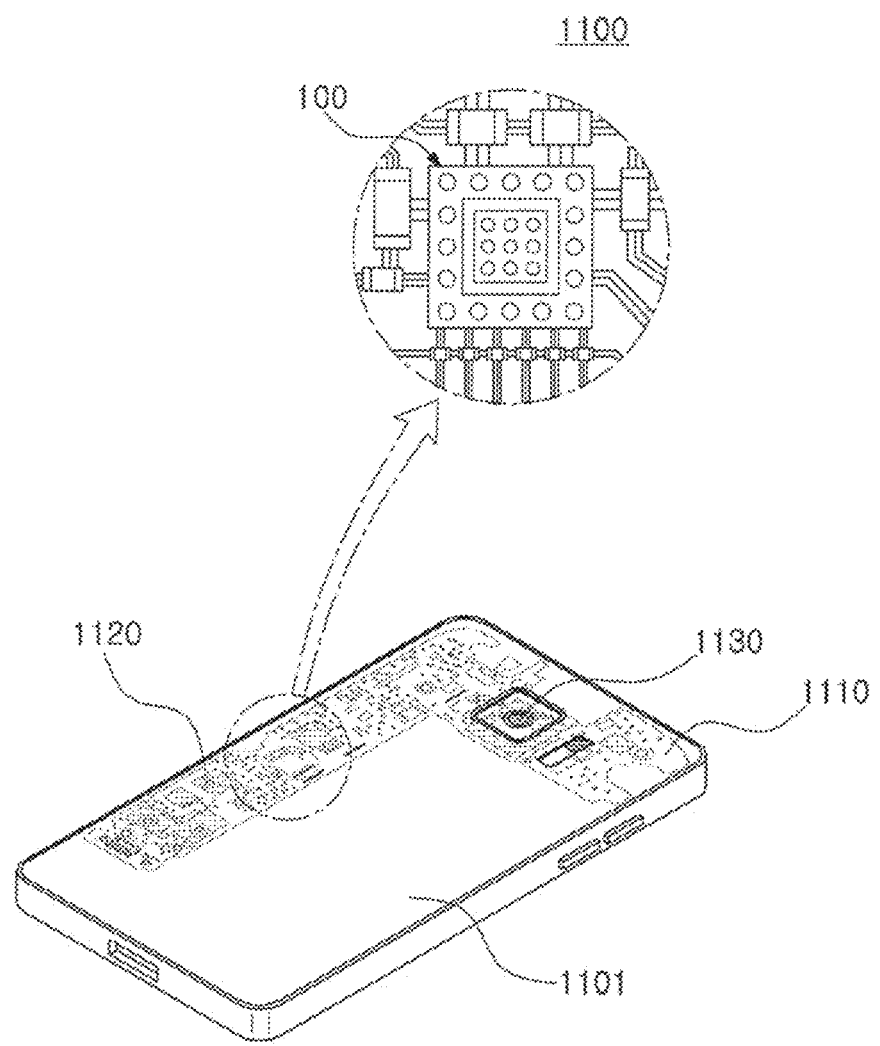
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices as described above. For example, a mother board 1110 may be accommodated in a body 1101 of a smartphone 1100, and various components 1120 may be physically or electrically connected to the mother board 1110. In addition, other components that may or may not be physically and/or electrically connected to the main board 1010, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 4:
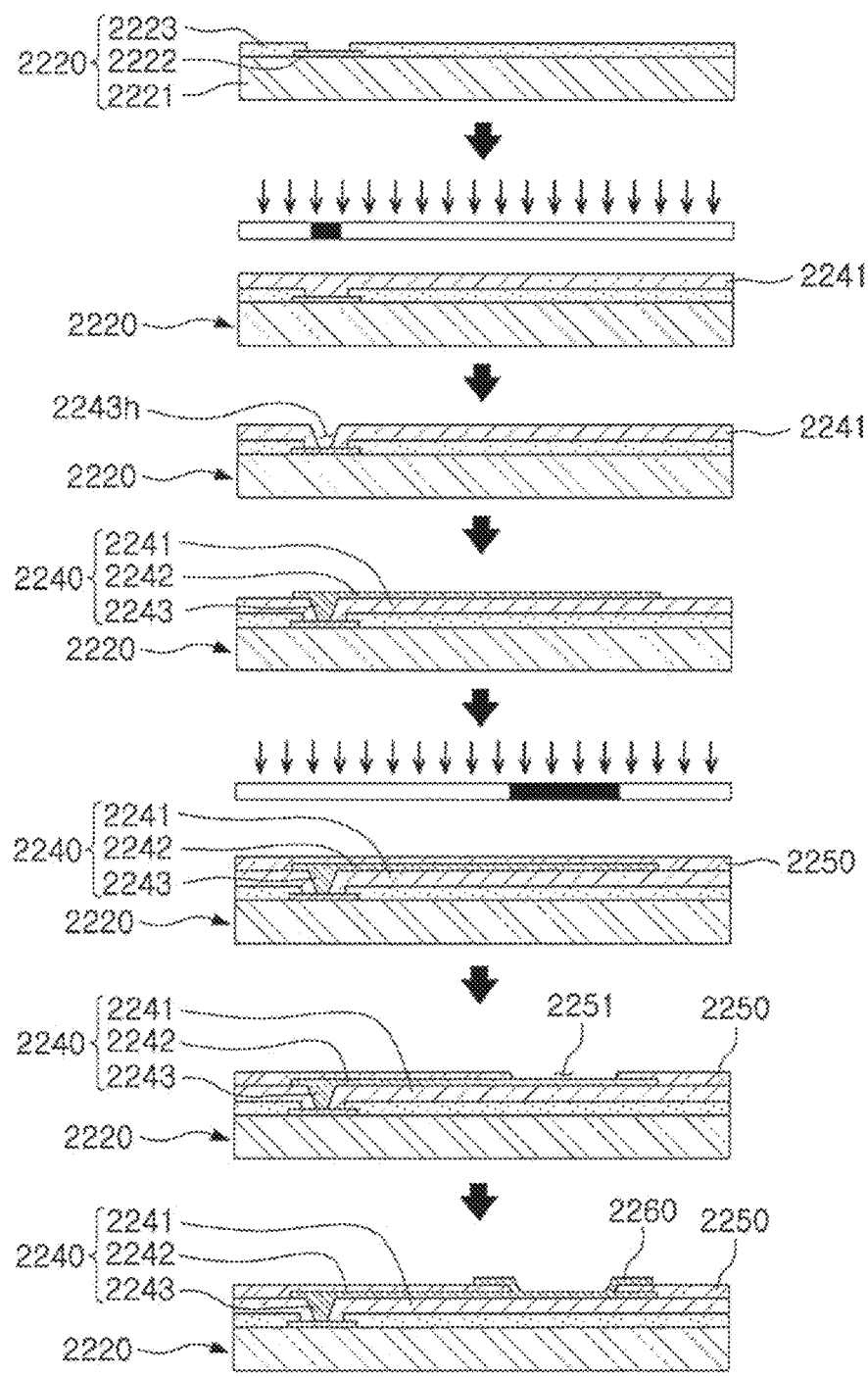
FIG. 4 is a schematic cross-sectional view illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photo imagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a small size. In addition, due to the disadvantage described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
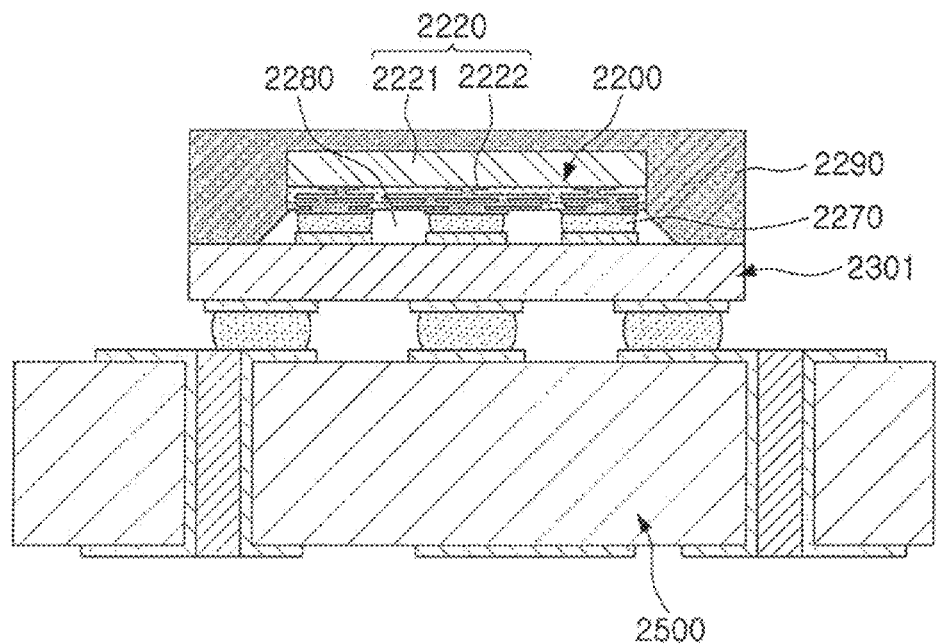
FIG. 5 is a schematic cross-sectional view illustrating a case in which a fan-in semiconductor package is mounted on an interposer substrate and is finally mounted on a main board of an electronic device.
Figure 6:
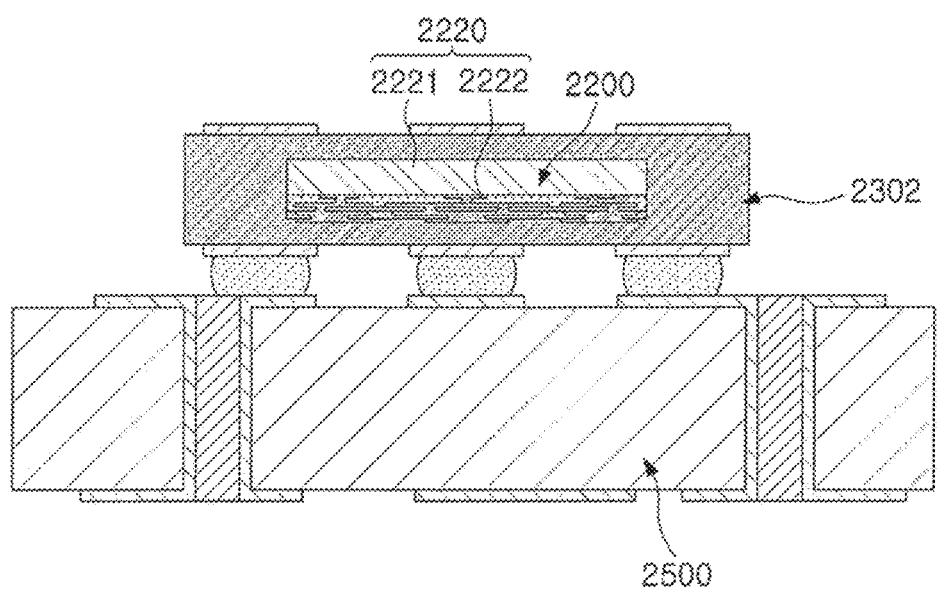
FIG. 6 is a schematic cross-sectional view illustrating a case in which a fan-in semiconductor package is embedded in an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device, and FIG. 6 is a schematic cross-sectional view illustrating a case in which a fan-in semiconductor package is embedded in an interposer substrate and is finally mounted on a main board of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Pan-out Semiconductor Package

Figure 7:
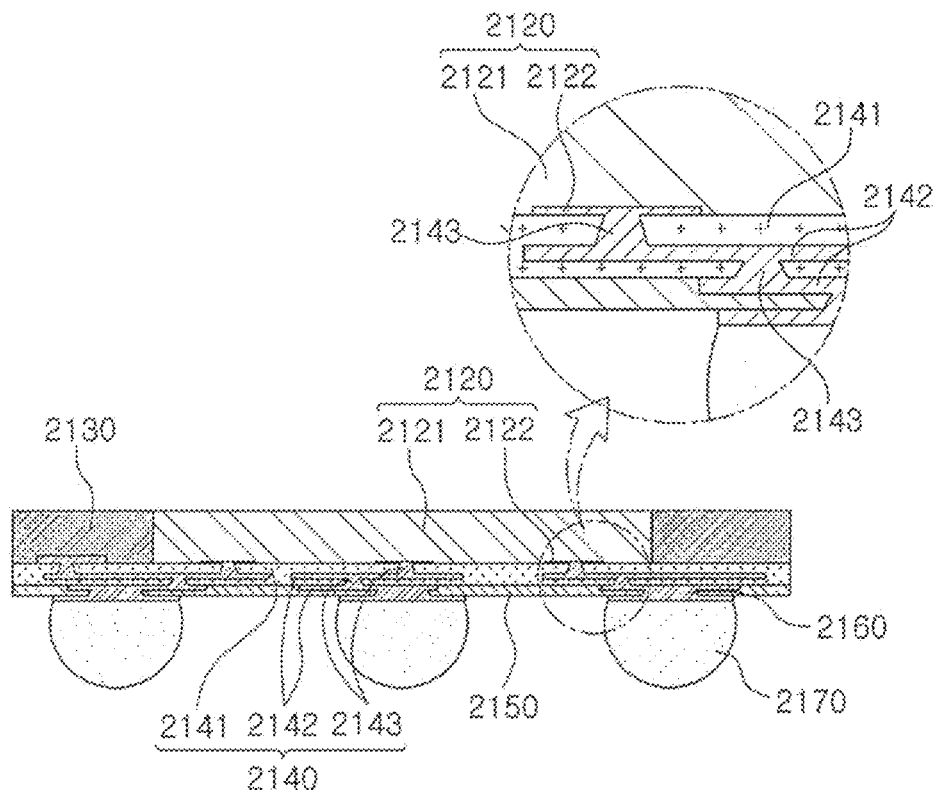
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2202 may be further formed on the connection member 2140, and an underbump metal layer 2160 may be further formed in openings of the passivation layer 2202. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2241, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width that becomes small as they become close to the semiconductor chip (see an enlarged region).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
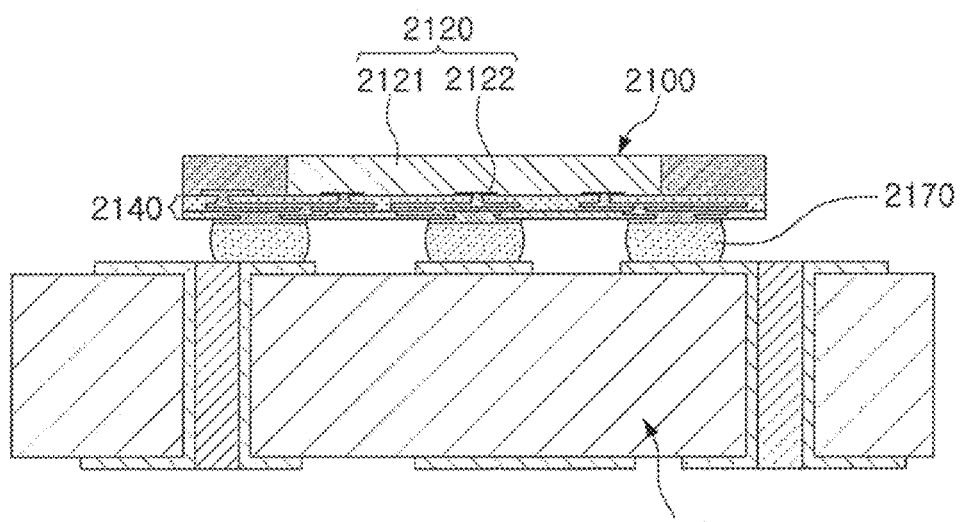
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Exemplary embodiments in the present disclosure will hereinafter be described in detail with reference to the accompanying drawings.

Figure 9:
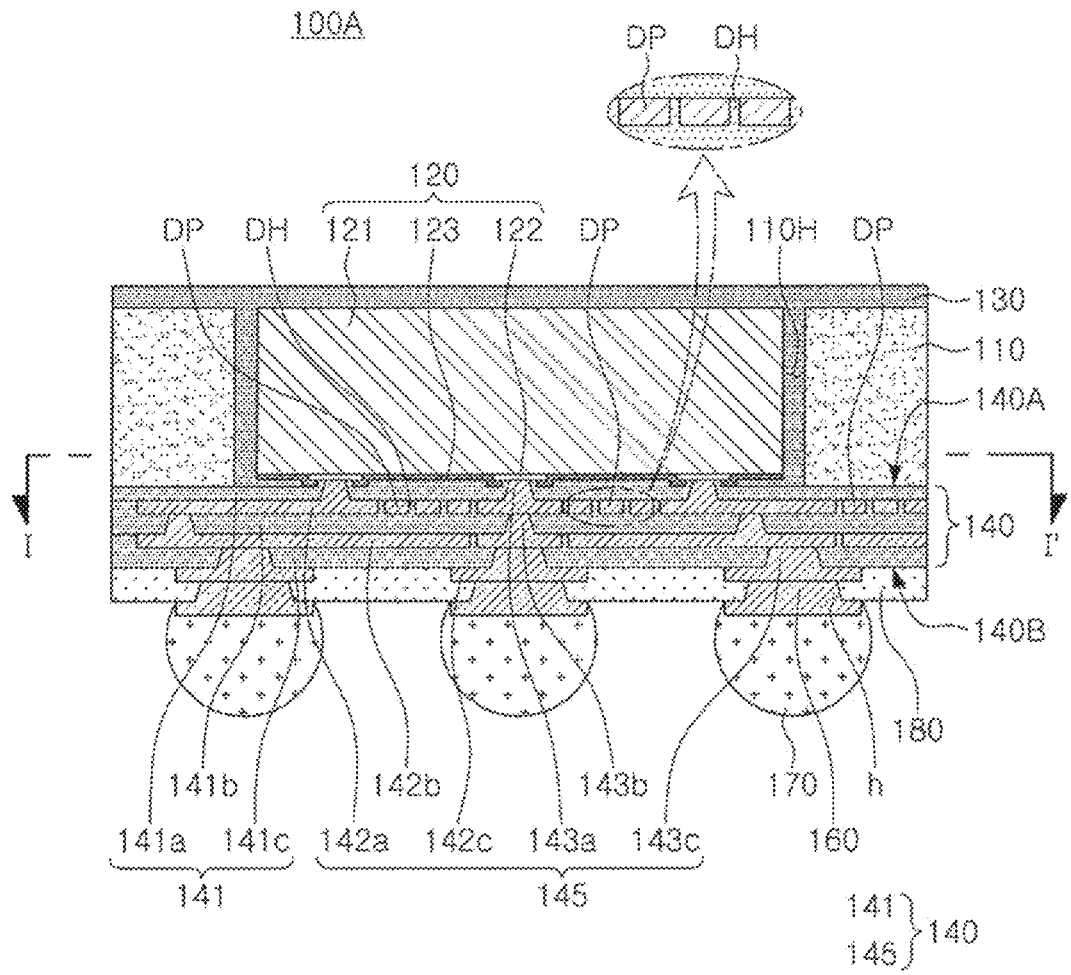
FIG. 9 is a side cross-sectional view illustrating a semiconductor package according to an exemplary embodiment in the present disclosure.
Figure 10:
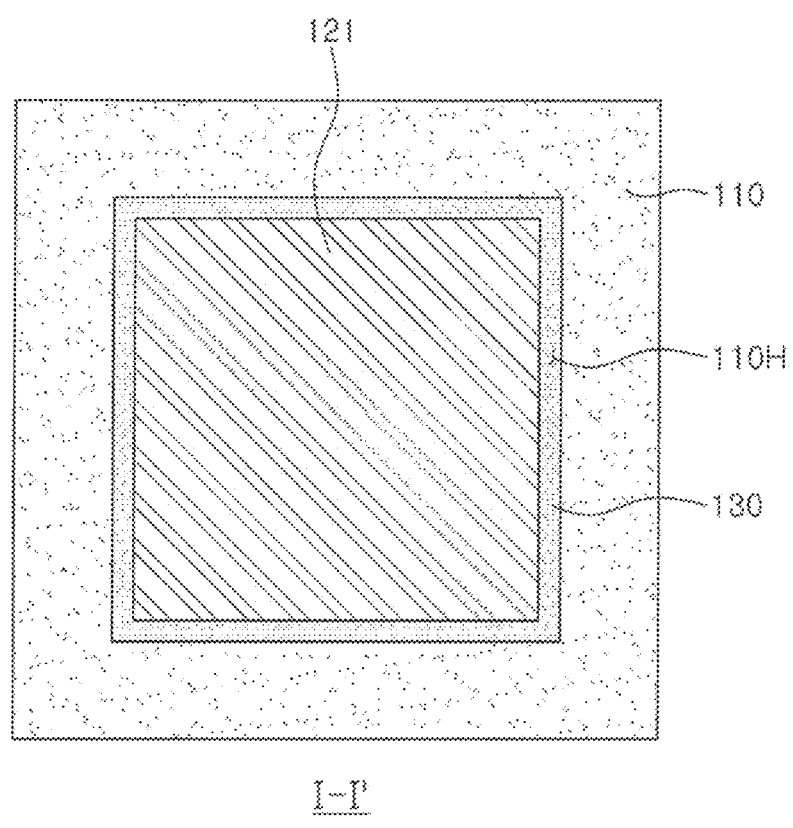
FIG. 10 is a plan view illustrating a semiconductor package illustrated in FIG. 9.

FIG. 9 is a side cross-sectional view illustrating a semiconductor package according to an exemplary embodiment in the present disclosure and FIG. 10 is a plan view illustrating a semiconductor package illustrated in FIG. 9.

Referring to FIGS. 9 and 10, a semiconductor package 100A according to the present exemplary embodiment may include a connection member 140 having a first surface 140A and a second surface 140B disposed to oppose each other and having redistribution layers 145, a semiconductor chip 120 disposed on the first surface 140A of the connection member 140 and having connection pads 122 connected to the redistribution layers 145, and an encapsulant 130 disposed on the first surface 140A of the connection member 140 and encapsulating the semiconductor chip 120.

In the present exemplary embodiment, the semiconductor package 100A may further include a supporting member 110 having a cavity 110H, and the supporting member 110 may be disposed on the first surface 140A of the connection member 140 so that the semiconductor chip 120 is disposed in the cavity 110H.

The connection member 140 employed in the present exemplary embodiment may include an insulating member 141 and a plurality of redistribution layers 145 disposed on different levels.

The insulating member 141 may include first to third insulating layers 141a, 141b, and 141c and may be formed of a photosensitive insulating material such as a PID resin. The material forming the insulating member 141 according to the present exemplary embodiment is not limited thereto, and an insulating resin having fluidity before forming the insulating layer and provided as the insulating layer after a curing process may be used.

Each of the redistribution layers 145 employed in the present exemplary embodiment may have a three-layer redistribution structure including a first wiring layer having a first wiring pattern 142a and a first via 143a, a second wiring layer having a second wiring pattern 142b and a second via 143b, and a third wiring layer having a third wiring pattern 142c and a third via 143c. The first to third wiring patterns 142a, 142b, and 142c may serve to redistribute the connection pads 122 of the semiconductor chip 120 together with the first to third vias 143a, 143b, and 143c.

As in the present exemplary embodiment, in the case in which the first to third insulating layers 141a, 141b, and 141c are formed of the photosensitive insulating material, the first to third insulating layers 141a, 141b, and 141c may be formed to be thinner and a fine pitch of the first to third vias 143a, 143b, and 143c may be more easily achieved.

The semiconductor package 100A according to the present exemplary embodiment may further include a dummy electrode pattern DP disposed on the same level as the first wiring pattern 142a in the insulating member 141. The dummy electrode pattern DP, which is a region not constituting a circuit, may be formed by the same process as the first wiring pattern 142a, and may be composed of a layer having the same material and thickness as the first wiring pattern 142a. For example, the dummy electrode pattern DP may be formed of copper (Cu) in the same manner as the first wiring pattern 142a.

A plurality of holes DH may be arranged in the dummy electrode pattern DP. The plurality of holes may serve to facilitate a discharge of moisture and gas in the material constituting the insulating member 141 (particularly, the first insulating layer 141a) and prevent delamination of the first wiring pattern 142a.

Specifically, in the process of forming the connection member 140, the holes DH formed in the dummy electrode pattern DP need to have a sufficient area to facilitate the discharge of moisture and gas in the insulating member 141 (e.g., the first insulating layer 141a) formed of a photosensitive material and to prevent the delamination of the first wiring pattern 142a and the insulating member 141.

However, as the area (or a width) of the holes DH is increased, a defect (particularly, a line width defect) of the circuit (e.g., the second wiring pattern 142b) formed thereon may occur to a large extent. Specifically, when the second insulating layer 141b is formed of a liquid photosensitive material, an undulation may occur in portions of the second insulating layer 141b overlapped with the holes DH due to shrinkage according to a thermal curing process, and a line width defect of the second wiring pattern 142b disposed on the second insulating layer 141b may occur due to the above-mentioned undulation. A detailed description thereof will be provided below with reference to FIGS. 13A through 13D.

In the present exemplary embodiment, a method of controlling a shape of the hole DH may be provided to relieve the undulation in the overlapped region of the insulating layer while securing a sufficient area of an opened region (a region from which the dummy electrode pattern is removed). A method of significantly reducing an influence on the second wiring pattern 142b disposed on the hole by changing the shape of the hole may be provided.

Specifically, a conventional de-gassing hole has a simple shape such as a circular shape or a quadrangular shape, but the hole DH employed in the present exemplary embodiment may has a shape including a plurality of protruding regions that protrude externally from different positions. In another aspect, each of the shapes of the plurality of holes DH may be represented by a concave polygon. The holes having the shape according to the present exemplary embodiment are illustrated in FIGS. 11 and 12.

Figure 11:
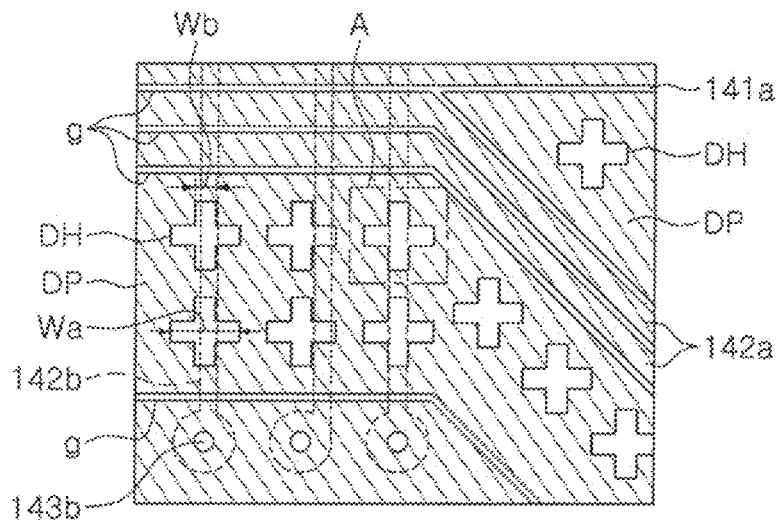
FIG. 11 is a plan view illustrating a redistribution layer employed in a semiconductor package according to an exemplary embodiment in the present disclosure.
Figure 12:
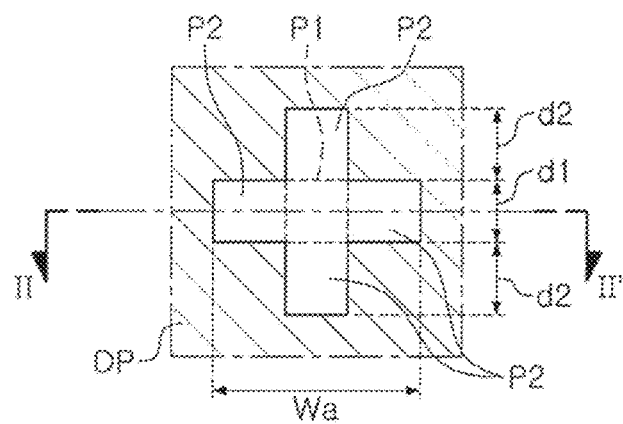
FIG. 12 is an enlarged plan view of a region "A" of the redistribution layer illustrated in FIG. 11.

FIG. 11 is a plan view illustrating a redistribution layer employed in a semiconductor package 100A according to an exemplary embodiment in the present disclosure and FIG. 12 is an enlarged plan view of a region "A" of the redistribution layer illustrated in FIG. 11. Here, FIG. 11 may be understood as a plan view of the dummy electrode pattern DP employed in FIG. 9.

Referring to FIG. 11, the dummy electrode pattern DP and the first wiring pattern 142a disposed on the first insulating layer 141a are illustrated by a solid line. The first wiring pattern 142a and the dummy electrode pattern DP may be separated from each other by an etch line g from which a metal such as a copper foil is removed. In addition, the second insulating layer (not shown in FIG. 11) may be disposed on the first insulating layer 141a as illustrated in FIG. 9, and the second wiring pattern 142b and the second via 143b formed on the second insulating layer are illustrated by a dotted line.

In the present exemplary embodiment, it is illustrated that the plurality of holes DH formed in the dummy electrode pattern DP have a cross shape. As illustrated in FIG. 11, the second wiring pattern 142b may have the region overlapped with the plurality of holes DH, and the overlapped region may have a line width Wb smaller than a maximum width Wa of the plurality of holes DH. In this arrangement, the undulation of the second insulating layer 141b described above may have a greater influence on the line width defect.

The cross shape employed in the plurality of holes DH according to the present exemplary embodiment may be defined as a shape having a central region P1 and four protruding regions P2 protruding from the central region P1 and arranged at an interval of 90°, as illustrated in FIG. 12.

Even if the central region P1 of the hole DH of the cross shape employed in the present exemplary embodiment is small, the plurality of protruding regions P2 may provide the sufficient area of the opened region. In addition, the hole DH of the cross shape may be designed to have a smaller width even though it has the same area of the opened region as the conventional hole (of the circular or quadrangular shape).

For example, when a length d1 and a width d2 of the protruding region P2 are set to 18 μm and 13 μm, respectively, a total area of the opened region may be 1.256 μm$^2$, and when the conventional circular hole is designed to have substantially the same area, a width (i.e., a diameter) of the circular hole may have 40 μm. As described above, in the case of the hole DH of the cross shape according to the present exemplary embodiment, the width of the opened region on an arbitrary line passing through the hole may be greatly reduced as compared to that of the conventional circular hole.

As described above, the hole DH of the cross shape may reduce the undulation due to the shrinkage of the insulating layer (the second insulating layer 141b) while appropriately acting as a de-gassing hole, by reducing the width (or a size) of the opened region in a local region while securing the area of the opened area similar to the conventional hole of a simple shape. As a result, the defect problem (particularly, the line width defect) of the second wiring pattern 142b disposed on the second insulating layer 141b may be relieved by solving an energy concentration phenomenon due to the undulation in an exposure process of the second insulating layer 141b.

The hole DH of the cross shape employed in the present exemplary embodiment may appropriately adjust the undulation of the region of the insulating layer overlapped with the total area of the opened region by using the length d1 and the width d2 of the protruding region P2. In order to obtain a sufficient undulation adjustment effect, the width d2 of the plurality of protruding regions P2 may be controlled to be twice or less that of the line width Wb of the overlapped region of the second wiring pattern 142b.

The respective components included in the semiconductor package 100A according to the present exemplary embodiment will hereinafter be described in more detail.

The supporting member 110 may improve rigidity of the semiconductor package 100A, and serve to secure uniformity of a thickness of the encapsulant 130. The redistribution layer 145 such as the wiring pattern and the via may be introduced into the supporting member 110, and in this case, the semiconductor package 100A may also be utilized as a package-on-package (POP) type package. In the cavity 110H, the semiconductor chip 120 may be disposed to be spaced apart from a side wall of the supporting member 110 by a predetermined distance. Side surfaces of the semiconductor chip 120 may be surrounded by the supporting member 110. However, such a form is only an example and may be variously modified to have other forms, and the first connection member 110 may perform another function depending on such a form. According to some exemplary embodiments, the supporting member 110 may be omitted.

The supporting member 110 may include an insulating material. The insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. When a material having high rigidity such as prepreg including the glass fiber is used as the insulating material, the supporting member 110 may also be utilized as a supporter for warpage control of the semiconductor package 100A.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the above-mentioned elements may also be combined with each other and be disposed.

The semiconductor chip 120 may be formed based on an active wafer. In this case, a base material of the body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 is not particularly limited and may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. The semiconductor chip 120 may be a bare die, a redistribution layer (not illustrated) may be further formed on the first surface (a surface on which the connection pads 122 are formed) of the semiconductor chip 120, if necessary, and bumps (not illustrated), or the like, may also be connected to the connection pads 122.

The encapsulant 130 may be provided as a structure for protecting the electronic components such as the supporting member 110, the semiconductor chip 120, and the like. An encapsulation form of the encapsulant 130 is not particularly limited, but may be a form in which the encapsulant 130 surrounds the supporting member 110 and the semiconductor chip 120. For example, the encapsulant 130 may cover the top surface of the supporting member 110 and the semiconductor chip 120, and fill spaces between side walls of the cavity 110H and the side surfaces of the semiconductor chip 120. In addition, the encapsulant 130 may also fill at least a portion of a space between the passivation layer 123 of the semiconductor chip 120 and the connection member 140. The encapsulant 130 may fill the cavity 110H to thus serve as an adhesive and reduce buckling of the semiconductor chip 120 depending on certain materials.

For example, the encapsulant 130 may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber, for example, prepreg, Ajinomoto Build-up Film (ABF), FR-4, Bismaleimide Triazine (BT), or the like, and in some exemplary embodiments, a photosensitive insulating material may also be used.

The connection member 140 may redistribute the connection pads 122 of the semiconductor chip 120. Several tens to several hundreds of connection pads 122 of the semiconductor chip 120 having various functions may be redistributed by the connection member 140, and may be physically and/or externally electrically connected through the electrical connection structures 170 depending on the functions.

The connection member 140 may have a different number of multilayer redistribution structure other than the three-layer wiring structure according to the present exemplary embodiment, and in some exemplary embodiments, the redistribution structure may also be configured by only a single layer (i.e., one wiring pattern+one via). In a final product, the first to third insulating layers 141a, 141b, and 141c may be integrated with one another depending on an applied process, such that a boundary thereamong may not be apparent. In the first to third insulating layers 141a, 141b, and 141c, a thickness of each of the insulating layers between the patterns except for the first to third wiring pattern 142a, 142b, and 142c may be about 1 μm to 10 μm.

The first to third wiring patterns 142a, 142b, and 142c, may include, for example, a conductive material such as copper (Cu), aluminum (Al), silver (Ag), tin (Sn), gold (Au), nickel (Ni), lead (Pb), titanium (Ti), or alloys thereof. The first to third wiring patterns 142a, 142b, and 142c may perform various functions depending on designs of the corresponding layers. For example, the redistribution layers 145 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first to third wiring patterns 142a, 142b, and 142c may include via pad patterns, electrical connection structure pad patterns, and the like. A thickness of each of the first to third wiring patterns 142a, 142b, and 142c may be about 0.5 μm to 15 μm.

The first to third vias 143a, 143b, and 143c may serve to connect (interlayer-connect) the first to third wiring patterns 142a, 142b, and 142c and the connection pads 122 which are formed on different layers to each other in a vertical direction. The first to third vias 143a, 143b, 143c, may include, for example, a conductive material such as copper (Cu), aluminum (Al), silver (Ag), tin (Sn), gold (Au), nickel (Ni), lead (Pb), titanium (Ti), or alloys thereof. The first to third vias 143a, 143b, and 143c may be completely filled with the conductive material, or the conductive material may also be formed only on a surface of a side wall of each of the vias. In addition, as a shape of the via, shapes known in the art such as a tapered shape, a cylindrical shape, or the like may be used.

The passivation layer 180 may protect the connection member 140 from external physical or chemical damage. The passivation layer 180 may have openings h exposing at least portions of the first to third redistribution layers 142a, 142b, and 142c of the connection member 140. The number of openings h formed in the passivation layer 180 may be several tens to several thousands. A material of the passivation layer 180 is not particularly limited, but may be the above-mentioned insulating material. For example, the passivation layer 180 may include at least one of prepreg, ABF, FR-4, BT, and solder resist.

The underbump metal layer 160 may improve connection reliability of the electrical connection structures 170 and improve board level reliability of the semiconductor package 100A. The underbump metal layer 160 may be connected to the redistribution layer 145 of the connection member 140 exposed through the openings h of the passivation layer 180. The underbump metal layer 160 may be formed in the openings h of the passivation layer 180 by the known metallization method using the known conductive material such as a metal, but is not limited thereto.

The electrical connection structures 170 may physically and/or externally electrically connect the fan-out semiconductor package 100A. For example, the fan-out semiconductor package 100A may be mounted on a mainboard of the electronic device through the electrical connection structures 170. Each of the electrical connection structures 170 may be formed of a conductive material, for example, a low melting point alloy, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a low melting point alloy. When the electrical connection structures 170 are formed as a single layer structure, the electrical connection structures 170 may include a low melting point alloy such as tin-silver or copper (Cu). However, this is only an example, and the electrical connection structures 170 are not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less.

At least one of the electrical connection structures 170 may be disposed in a fan-out region. The fan-out region is a region except for a region in which the semiconductor chip 120 is disposed. The fan-out package may have reliability greater than that of a fan-in package, may implement a plurality of I/O terminals, and may easily perform 3D interconnection. In addition, as compared to a ball grid array (BGA) package, a land grid array (LGA) package, or the like, the fan-out package may be manufactured to have a small thickness.

Meanwhile, although not illustrated in the drawings, a metal thin film may be formed on the walls of the cavity 110H, if necessary, in order to dissipate heat and/or block electromagnetic waves. According to some exemplary embodiments, a plurality of semiconductor chips 120 performing functions that are the same as or different from each other may be disposed in the cavity 110H, if necessary. According to some exemplary embodiments, a separate passive component such as an inductor, a capacitor, or the like, may be disposed in the cavity 110H, if necessary. According to some exemplary embodiments, a passive component, for example, a surface mounted technology (SMT) component including an inductor, a capacitor, or the like, may be disposed on a surface of the passivation layer 180, if necessary.

A mechanism in which the undulation of the insulating layer generated by the hole employed for de-gassing causes the defect of the wiring pattern disposed on the insulating layer and an effect of the present disclosure for reducing the defect of the wiring pattern will hereinafter be described with reference to FIGS. 13A through 13D.

FIGS. 13A through 13D are cross-sectional views for describing processes of manufacturing the redistribution layer corresponding to the region "A" of FIG. 11.

Figure 13A:
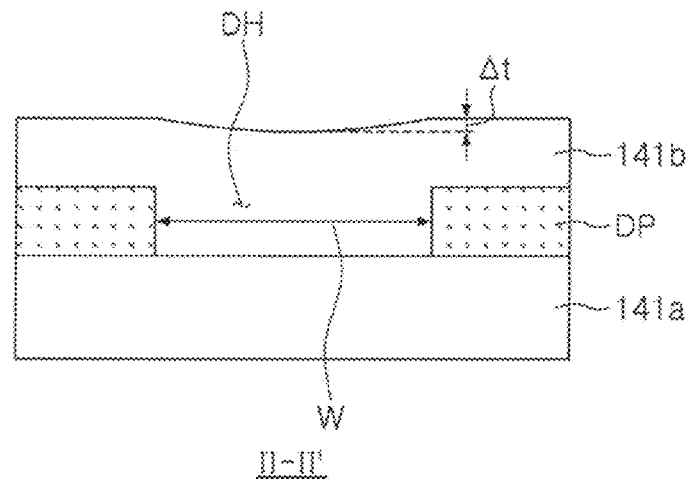
FIGS. 13A through 13D are cross-sectional views for describing processes of manufacturing a portion of the redistribution layer corresponding to the region "A" of FIG. 11.

Referring to FIG. 13A, the dummy electrode pattern DP having the hole DH may be formed on the first insulating layer 141a and the second insulating layer 141b may be formed on the dummy electrode pattern DP.

In the present process, since the second insulating layer 141b is formed of a liquid insulating material (e.g., a photosensitive material), an undulation (Δt) may occur in a portion of the second insulating layer 141b overlapped with the hole DH due to shrinkage according to a thermal curing process. As a width Wa of the hold DH is larger, such an undulation (Δt) may become larger.

Figure 13B:
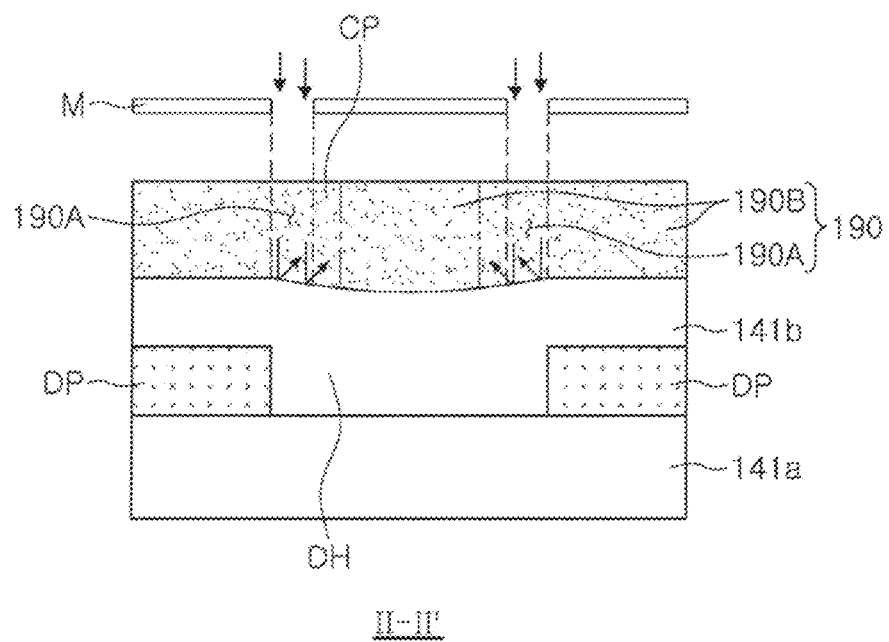

As illustrated in FIG. 13B, an exposure process may be performed for the photoresist layer 190 using a mask L.

Slits of the photomask 30 may be used to expose ultraviolet light to a desired region. For example, the exposed region 190A may be cured by ultraviolet light and remain after being developed, and an unexposed region 190B may be decomposed and removed using a developer in a subsequent process. In the exposure process described above, the second insulating layer 141b in which the undulation (Δt) is formed may act as a concave lens to expose an additional region CP in which ultraviolet light overlaps the hole DH as indicated by an arrow.

Figure 13C:
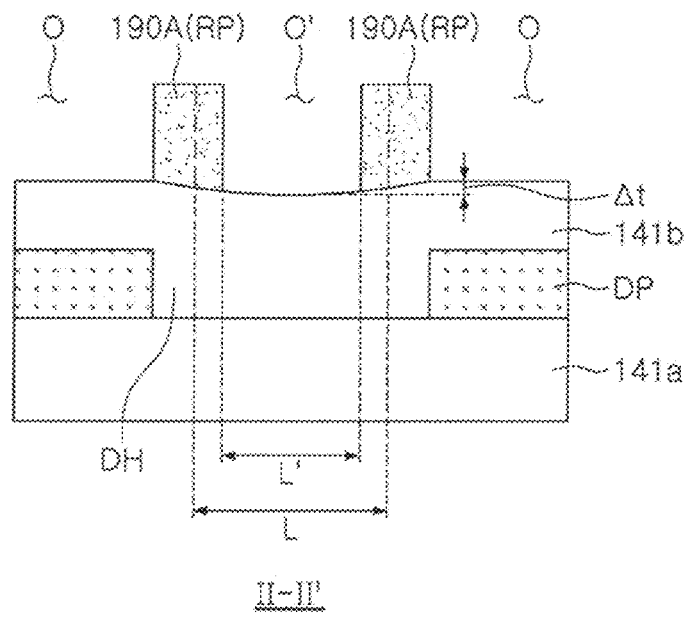

As a result, as illustrated in FIG. 13C, the region 190A exposed after development may be provided as a photoresist pattern RP for the second wiring pattern, and an opening O' overlapped with the hole among the openings of the photoresist pattern RP may obtain a line width L' smaller than an intended line width L.

Figure 13D:
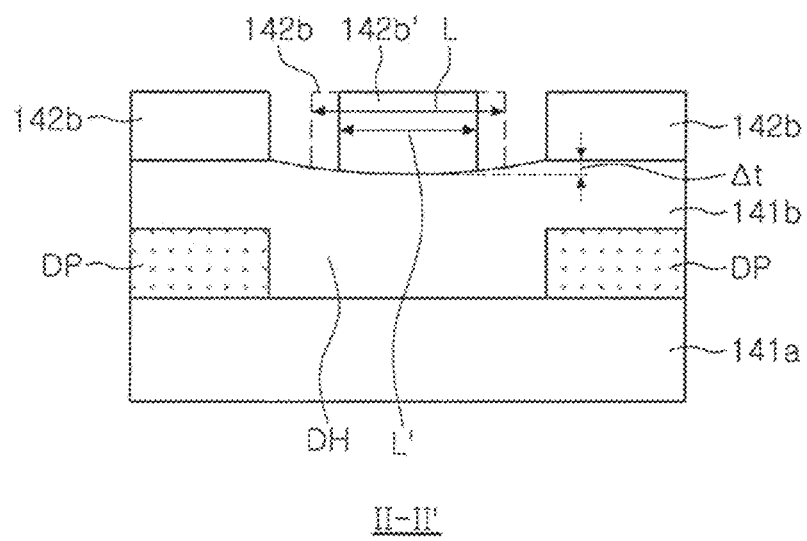

Next, as illustrated in FIG. 13D, the second wiring pattern 142b may be formed using the above-mentioned photoresist pattern RP, and after forming the second wiring pattern 142b, the photoresist pattern RP may be removed through a lift-off process. For example, the photoresist pattern RP may also be removed by using an appropriate process such as an ashing process, an etching process, or a combination thereof.

As illustrated in FIG. 13D, since energy is concentrated on the region overlapped with the hole DH in the exposure process of the second wiring pattern 142b, the line width L' of the second wiring pattern 142b may be smaller than an originally designed line width L, and such a defect of the line width may be increased according to the degree of the undulation (at) of the second insulating layer 141b.

Therefore, in order to reduce the undulation (at), the hole DH employed for de-gassing may be designed to a shape having a plurality of protruding regions so that an opened region secures a sufficient area and a width of the hole DH becomes smaller in local regions.

Figure 14A:
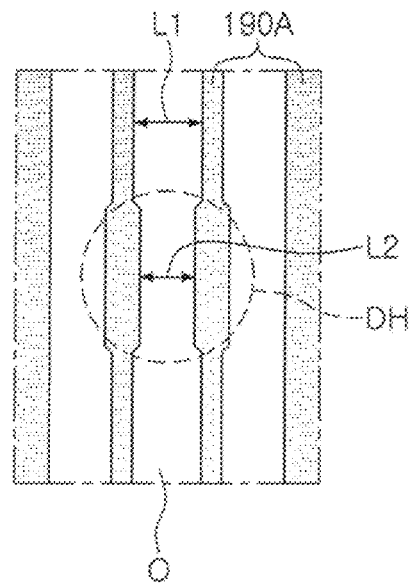
FIGS. 14A through 14C are plan views illustrating a photoresist pattern formed on a dummy electrode pattern having holes of different shapes or different arrangements.
Figure 14B:
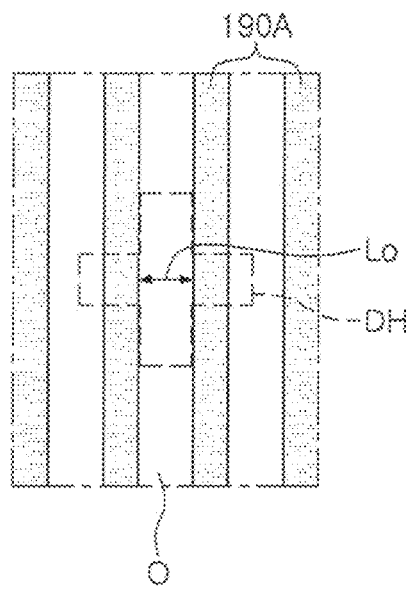
Figure 14C:
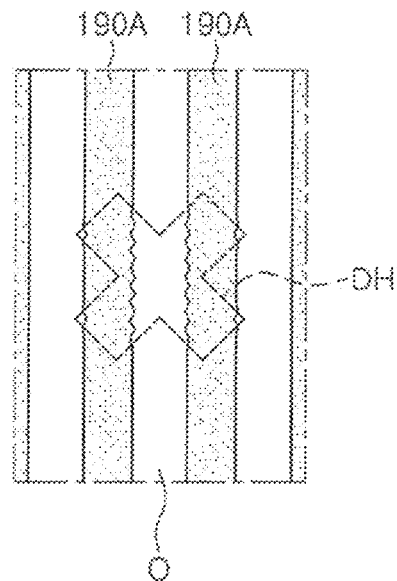

FIGS. 14A through 14C are plan views illustrating a photoresist pattern 190A formed on a dummy electrode pattern having holes of different shapes or different arrangements.

The holes DH illustrated in FIGS. 14A and 14B may have the same area of the opened region as each other and have a circular shape (a conventional example) and a cross shape, respectively.

Since the circular hole DH illustrated in FIG. 14A has a relatively large width across an entire region, energy (e.g., ultraviolet light) is inwardly reflected due to a large undulation in the exposure process, such that the photoresist pattern 190A in the region overlapped with the hole DH may be provided with a line-shaped opening O having a width L1 greater than a width L2 of another region. A circuit line may be formed in a non-uniform line width by the line-shaped opening O, and in a severe case, the circuit line may be shorted in the region overlapped with the hole DH.

On the other hand, the hole DH of the cross shape illustrated in FIG. 14B has the same area of the opened region as that of the hole DH illustrated in FIG. 14A, but since a width (or size) of the opened region in the local regions provided by the plurality of protruding regions is relatively largely reduced, the undulation of the overlapped insulating layer may also be relieved. Therefore, since an influence (undesired energy concentration) due to the undulation in the exposure process may be reduced, the photoresist 190A obtained after development may have a line-shaped opening O of a relatively constant line width Lo, and a circuit line having a relatively constant line width may also be formed by the line-shaped opening O.

Through the shape of the hole DH according to the present exemplary embodiment, the line width of the region of the circuit line (i.e., the second wiring pattern) overlapped with the hole DH may be substantially equal to the line width of other regions or may be controlled to have a difference which is less than 10% even if there is a difference therebetween.

Meanwhile, the hole DH of the cross shape illustrated in FIG. 14B may have a similar effect even if the circuit line is formed in any direction. For example, as illustrated in FIG. 14C, even in a case in which the hole DH of the cross shape of FIG. 14B is rotated by 45° and is arranged, since the width of the opened region is relatively reduced by the plurality of protruding regions, the undulation occurring in the overlapped region of the insulating layer may be greatly relieved. As a result, similarly to the shape illustrated in FIG. 14B, the opening O for the circuit line may have a relatively constant line width even in the region overlapped with the hole DH.

The exemplary embodiment described above illustrates that the plurality of holes have the cross shape, but the shape of the plurality of holes is not limited thereto and the holes may have other shapes including a plurality of protruding regions that protrude externally from different positions. In another aspect, each of the shapes of the plurality of holes may be represented by a concave polygon. Holes of various shapes employable in the present exemplary embodiments will hereinafter be described with reference to FIGS. 15A through 15C.

Figure 15A:
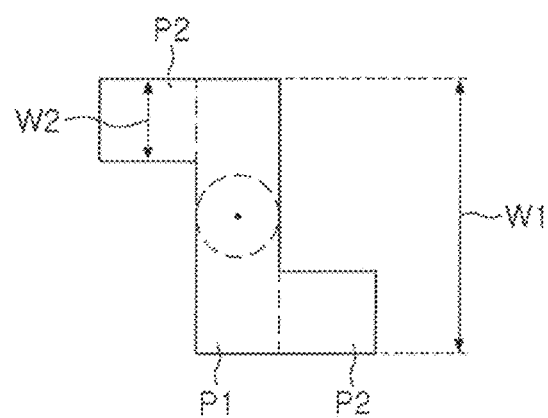
FIGS. 15A through 15C are plan views illustrating holes of various shapes employable in an exemplary embodiment in the present disclosure.
Figure 15B:
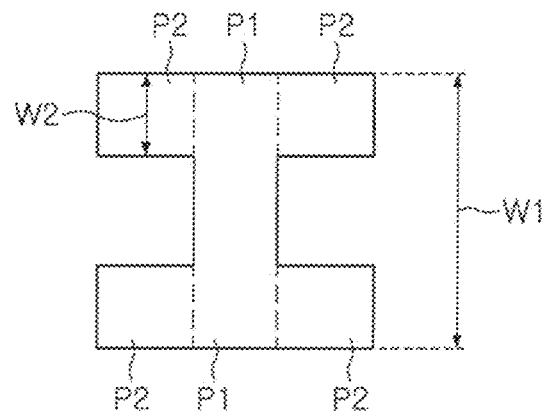
Figure 15C:
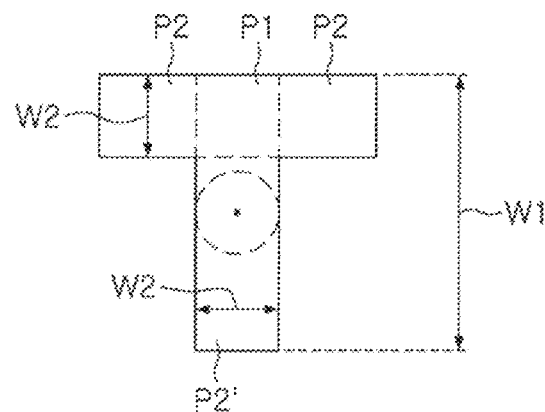

FIGS. 15A through 15C illustrate cross sections of holes of a Z shape, an I shape, and a T shape, respectively.

The hole illustrated in FIG. 15A may have a Z shape in which two protruding regions P2 having a width W2 smaller than a total width W1 extend from an upper end an a lower end of a central region P1, which is a rectangle, and the two protruding regions P2 protrude in different directions.

In the hole illustrated in FIG. 15B, similarly to the previous example, the protruding regions P2 having the width W2 smaller than the total width W1 may extend from the upper end and the lower end of the central region P1, which is the rectangle. The number of the protruding regions employed in the present exemplary embodiment is four and may have an I shape in which the protruding regions protrude in opposite directions from the upper end and the lower end of the central region P1.

The hole illustrated in FIG. 15C may have a T shape in which two protruding regions P2 having a width W2 smaller than a total width W1 extend from only one end (i.e., the upper end) of the central region P1, which is the rectangle, and the two protruding regions P2 protrude in opposite directions.

As described above, the de-gassing hole capable of reducing the occurrence of the undulation of the insulating layer by reducing the width (or the size) of the opened region in the local region while securing the sufficient area of the opened region by providing the holes of various shapes to which the plurality of protruding regions are added may be provided, and as a result, the line width defect problem of the wiring pattern disposed on the insulating layer may be greatly relieved by solving the energy concentration phenomenon due to the undulation in the exposure process of the insulating layer.

Figure 16:
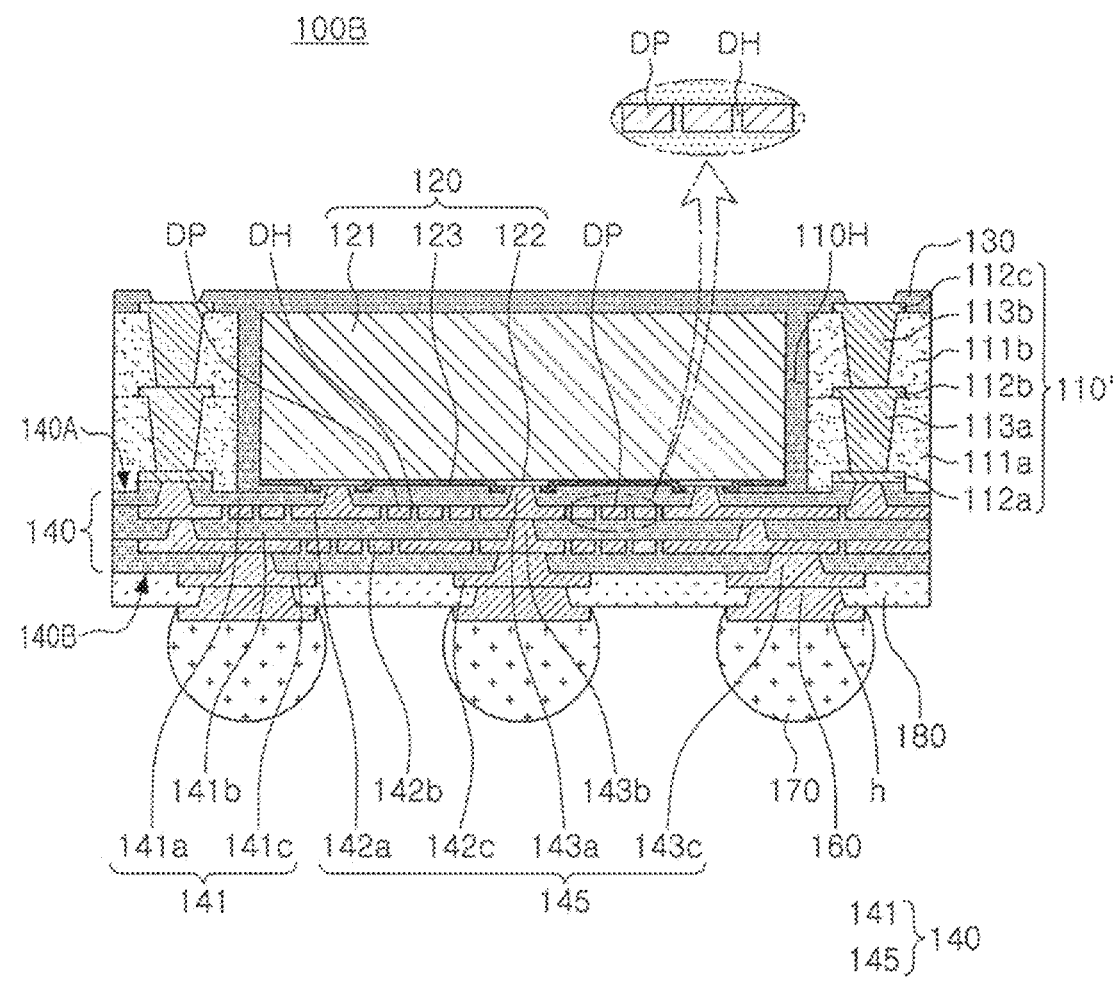
FIG. 16 is a side cross-sectional view illustrating a semiconductor package according to an exemplary embodiment in the present disclosure.

FIG. 16 is a side cross-sectional view illustrating a semiconductor package according to an exemplary embodiment in the present disclosure.

Referring to FIG. 16, a semiconductor package 100B according to the present exemplary embodiment may be understood to be similar to the structure illustrated in FIG. 9, except that it has a supporting member 110' having a wiring structure, and a dummy electrode pattern DP is implemented on a plurality of redistribution layers 145. Components according to the present exemplary embodiment may be understood with reference to the description for the same or similar components of the semiconductor package 100A illustrated in FIG. 9 unless explicitly described to the contrary.

A supporting member 110' employed in the present exemplary embodiment may include a first dielectric layer 111*a* in contact with a connection member 140, a first wiring layer 112*a* in contact with the connection member 140 and embedded in the first dielectric layer 111*a*, a second wiring layer 112*b* disposed on the other surface of the first dielectric layer 111*a* opposing one surface of the first dielectric layer 111*a* in which the first wiring layer 112*a* is embedded, a second dielectric layer 111*b* disposed on the first dielectric layer 111*a* and covering the second wiring layer 112*b*, and a third wiring layer 112*c* disposed on the second dielectric layer 111*b*. The first to third wiring layers 112*a*, 112*b*, and 112*c* may be electrically connected to connection pads 122. The first and second wiring layers 112*a* and 112*b* and the second and third wiring layers 112*b* and 112*c* may be electrically connected to each other through first and second vias 113*a* and 113*b* penetrating through the first and second dielectric layers 111*a* and 111*b*, respectively.

When the first wiring layer 112*a* is embedded in the first dielectric layer 111*a* as in the present exemplary embodiment, an undulation generated due to a thickness of the first wiring layer 112*a* may be significantly reduced, and an insulating distance of the connection member 140 may thus become constant. That is, a difference between a distance from a first wiring pattern 142*a* of the connection member 140 to a lower surface of the first dielectric layer 111*a* and a distance from the first wiring pattern 142*a* of the connection member 140 to the connection pad 122 of a semiconductor chip 120 may be smaller than a thickness of the first wiring layer 112*a*. Therefore, a high density wiring design of the connection member 140 may be easy.

The lower surface of the first wiring layer 112*a* of the supporting member 110' may be disposed on a level above a lower surface of the connection pad 122 of a semiconductor chip 120. In addition, a distance between the first wiring pattern 142*a* of the connection member 140 and the first wiring layer 112*a* of the supporting member 110' may be greater than that between the first wiring pattern 142*a* of the connection member 140 and the connection pad 122 of the semiconductor chip 120. The reason is that the first wiring layer 112*a* may be recessed into the first insulating layer 111*a*.

As described above, when the first wiring layer 112*a* is recessed into the first insulating layer 141*a*, such that the lower surface of the first dielectric layer 111*a* and the lower surface of the first wiring layer 112*a* have an undulation therebetween, a phenomenon in which a material of the encapsulant 130 bleeds to pollute the first wiring layer 112*a* may be prevented. The second wiring layer 112b of the supporting member 110 may be disposed between an active surface and an inactive surface of the semiconductor chip 120. The supporting member 110' may have a thickness corresponding to the thickness of the semiconductor chip 120. Therefore, the second wiring layer 112b formed in the supporting member 110' may be disposed on a level between the active surface and the inactive surface of the semiconductor chip 120.

Thicknesses of the first to third wiring layers 112a, 112b, and 112c of the supporting member 110' may be thicker than those of the first to third wiring patterns 142a, 142b, and 142c of the connection member 140 and the dummy electrode pattern DP.

A material of the first and second dielectric layers 111a and 111b is not particularly limited and may be, for example, a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber, for example, prepreg, Ajinomoto Build-up Film (ABF), FR-4, Bismaleimide Triazine (BT), or the like. According to some exemplary embodiments, a PID resin may also be used.

The first to third wiring layers 112a, 112b, and 112c may serve to redistribute the connection pads 122 of the semiconductor chip 120. For example, the first to third wiring layers 112a, 112b, and 112c may include copper (Cu), aluminum (Al), silver (Ag), tin (Sn), gold (Au), nickel (Ni), lead (Pb), titanium (Ti), or alloys thereof. Similarly to the first to third wiring patterns 142a, 142b, and 142c described above, the first to third wiring layers 112a, 112b, and 112c may perform various functions (e.g., ground and the like) depending on a design of the corresponding layer.

In the semiconductor package 100B according to the present exemplary embodiment, the dummy electrode pattern DP having a plurality of holes DH may be introduced into the first redistribution layers 142a and 143a and the second redistribution layers 142b and 143b. The dummy electrode pattern DP may be disposed on the same level as the first and second wiring patterns 143a in the insulating member 141, and may be formed by the same process as the first wiring pattern 142a and the second wiring pattern 142b, respectively. For example, the dummy electrode pattern DP may be formed of copper (Cu) in the same manner as the first and second wiring patterns 142a and 142b.

The plurality of holes DH employed in the present exemplary embodiment may have shapes including a plurality of protruding regions that protrude externally from different positions, similarly to the exemplary embodiment described above. In another aspect, each of the shapes of the plurality of holes DH may be represented by a concave polygon.

The above-mentioned hole DH may relieve the undulation in the overlapped region of the second and third insulating layers 141b and 141c while securing a sufficient area of an opened region, and as a result, an influence on the second and third wiring patterns 142b and 142c disposed on the hole DH may be significantly reduced. In another exemplary embodiment, the dummy electrode pattern may also be introduced into all of the three redistribution layers, if necessary.

Although the exemplary embodiments described above illustrate a form in which the dummy electrode pattern having the hole according to the present exemplary embodiment is employed in the connection member, the dummy electrode pattern having the hole according to the present exemplary embodiment may also be applied not only to the connecting member described above, but also to other types of package substrates.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first component may be named a second component and a second component may also be similarly named a first component, without departing from the scope of the present disclosure.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to an exemplary embodiment in the present disclosure, a dummy electrode pattern having a plurality of holes of a shape (e.g., a cross shape) having a plurality of extending parts extended in a width narrower than a maximum width in a direction intersecting a direction of the maximum width is introduced, such that a sufficient total area may be secure and an occurrence of an undulation of an insulating layer to be formed on a hole may be reduced. As a result, a reduction in a line width of a fine circuit line to be formed on the insulating layer may be significantly reduced.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a connection member having a first surface and a second surface opposing each other and including an insulating member and a plurality of redistribution layers disposed on different levels of the insulating member;
   a supporting member disposed on the first surface of the connection member and having a cavity accommodating the semiconductor chip;

a semiconductor chip disposed on the first surface of the connection member in the cavity and having connection pads electrically connected to the plurality of redistribution layers; and an encapsulant disposed on the first surface of the connection member and encapsulating the semiconductor chip, wherein at least one redistribution layer of the plurality of redistribution layers includes a dummy electrode pattern having a plurality of holes, and each of the plurality of holes has a shape including a plurality of protruding regions that protrude outwardly from different positions on the dummy electrode pattern, wherein a redistribution layer adjacent to the at least one redistribution layer includes a wiring pattern having a region overlapped with the plurality of holes, the wiring pattern of the redistribution layer has a line width narrower than a maximum width of the plurality of holes, and a width of the plurality of protruding regions is less than twice the line width of the wiring pattern of the redistribution layer.

2. The semiconductor package of claim 1, wherein a width of the region of the wiring pattern overlapped with the plurality of holes is approximately equal to a width of other regions or is smaller than the width of the other regions by less than 10%.

3. The semiconductor package of claim 1, wherein each of the plurality of holes having a concave polygonal shape.

4. The semiconductor package of claim 1, wherein each of the plurality of holes has the shape selected from a cross shape, a Z shape, an I shape, and a T shape.

5. The semiconductor package of claim 1, wherein each of the plurality of holes has a cross shape defined as the shape having a central region and four protruding regions protruding from the central region and arranged at an interval of 90°.

6. The semiconductor package of claim 1, wherein the insulating member includes an insulating resin.

7. The semiconductor package of claim 1, further comprising electrical connection structures disposed on the second surface of the connection member, and an under-bump metal (UBM) layer electrically connecting the electrical connection structures and the plurality of redistribution layers to each other.

8. The semiconductor package of claim 1, wherein the semiconductor chip is spaced apart from a side wall of the supporting member by a predetermined distance.

9. The semiconductor package of claim 1, wherein the supporting member includes a wiring structure that connects an upper surface and a lower surface of the supporting member, and the wiring structure is electrically connected to the plurality of redistribution layers.

10. The semiconductor package of claim 1, wherein the different levels of the insulating member include a first level adjacent to the first surface of the connection member and a second level adjacent to the second surface of the connection member, and the plurality of redistribution layers include a first redistribution layer disposed on the first level and connected to the connection pads of the semiconductor chip, and a second redistribution layer disposed on the second level and connected to the first redistribution layer.

11. The semiconductor package of claim 10, wherein the at least one redistribution layer includes the first redistribution layer.

12. The semiconductor package of claim 10, wherein the plurality of redistribution layers further include a third redistribution layer disposed to be closer to the second surface of the connection member than the second redistribution layer, wherein the at least one redistribution layer further includes the second redistribution layer.

13. A semiconductor package comprising:
a connection member including an insulating member and a plurality of redistribution layers disposed on different levels of the insulating member;

a semiconductor chip disposed on the connection member and having connection pads electrically connected to the plurality of redistribution layers;

an encapsulant disposed on a first surface of the connection member and encapsulating the semiconductor chip; and a wiring structure having a bottom end connected to the plurality of redistribution layers and a top end exposing from an upper surface of the encapsulant, wherein at least one redistribution layer of the plurality of redistribution layers includes a dummy electrode pattern having a plurality of holes, and each of the plurality of holes has a concave polygonal shape, wherein a redistribution layer adjacent to the at least one redistribution layer includes a wiring pattern having a region overlapped with the plurality of holes, and the wiring pattern of the redistribution layer has a line width narrower than a maximum width of the plurality of holes, wherein a width of the region of the wiring pattern overlapped with the plurality of holes is approximately equal to a width of other regions or is smaller than the width of the other regions by less than 10%.

14. The semiconductor package substrate of claim 13, wherein each of the plurality of holes has a cross shape having a central region and four protruding regions protruding from the central region.

15. The semiconductor package substrate of claim 14, wherein a width of each of the four protruding regions is less than twice the line width of the wiring pattern of the redistribution layer.

16. The semiconductor package of claim 13, wherein each of the plurality of holes has a shape selected from a cross shape, a Z shape, an I shape, and a T shape.

17. A semiconductor package comprising:
a connection member having a first surface and a second surface opposing each other and including an insulating member and a plurality of redistribution layers disposed on different levels of the insulating member;

a supporting member disposed on the first surface of the connection member and having a cavity accommodating the semiconductor chip;

a semiconductor chip disposed on the connection member in the cavity and having connection pads electrically connected to the plurality of redistribution layers;

an encapsulant disposed on the first surface of the connection member and encapsulating the semiconductor chip, a passivation layer disposed on the second surface of the connection member;

a plurality of UBM layer disposed on the passivation layer, and electrically connected to the plurality of redistribution layers through an insulating layer; and a plurality of electrical connection structures disposed on the plurality of UBM layers, respectively, wherein the plurality of redistribution layers include a first redistribution layer disposed on a first level and connected to the connection pads of the semiconductor chip, and a second redistribution layer disposed on a second level adjacent to the first level and connected to the first redistribution layer, wherein the first redistribution layer includes a first dummy electrode pattern having a plurality of first holes, each of the plurality of first holes having a concave polygonal shape, and the second redistribution layer includes a wiring pattern having a region overlapped with the plurality of first holes and having a line width narrower than a maximum width of the plurality of first holes, wherein the concave polygonal shape has a central region and a plurality of protruding regions protruding from the central region, a width of each the plurality of protruding regions being less than twice the line width of the wiring pattern of the second redistribution layer.

18. The semiconductor package of claim 17, wherein a width of the region of the wiring pattern overlapped with the plurality of first holes is approximately equal to a width of other regions or is smaller than the width of the other regions by less than 10%.

19. The semiconductor package of claim 17, wherein the plurality of redistribution layers further include a third redistribution layer disposed to be closer to the second surface of the connection member than the second redistribution layer.

20. The semiconductor package of claim 19, wherein the second redistribution layer further includes a second dummy electrode pattern having a plurality of second holes, each of the plurality of second holes having a concave polygonal shape, and the third redistribution layer includes a wiring pattern having a region overlapped with the plurality of second holes and having a line width narrower than a maximum width of the plurality of second holes.

* * * * *